United States Patent [19]

Ellisman et al.

[11] Patent Number: 5,414,261
[45] Date of Patent: May 9, 1995

[54] ENHANCED IMAGING MODE FOR TRANSMISSION ELECTRON MICROSCOPY

[75] Inventors: Mark H. Ellisman, Solana Beach; Gary G. Y. Fan; Jeff Price, both of San Diego, all of Calif.; Seiichi Suzuki, Tokyo, Japan

[73] Assignee: The Regents of the University of California, Oakland, Calif.

[21] Appl. No.: 86,237

[22] Filed: Jul. 1, 1993

[51] Int. Cl.$^6$ ............................................. H01J 37/04
[52] U.S. Cl. .................................. 250/311; 250/307; 250/397
[58] Field of Search .................. 250/311, 307, 396 R, 250/397, 396 ML, 306

[56] References Cited

U.S. PATENT DOCUMENTS

| | | | |
|---|---|---|---|
| 4,194,116 | 3/1980 | Egle | 250/311 |
| 4,434,367 | 2/1984 | Yonezawa | 250/311 |
| 5,084,618 | 1/1992 | Ito | 250/311 |

OTHER PUBLICATIONS

"Design and Calibration of an IVEM for General 3-Dimensional Image of Non-Diffracting Materials", Neil Rowlands, et al., 50th Mtg of EMSA, 1992.
"Optimization of Digital Filters for the Detection of Trace Elements in Electron Energy Loss Spectroscopy II. Experiments", J. Michel, et al., Ultramicroscopy 48 (1993) 121–132, North-Holland.
"Resolution Enhancement by Deconvolution Using a Field Emission Source in Electron Energy Loss Spectroscopy", P. E. Batson, et al., Ultramicroscopy 41 (1992) 137–145 North-Holland.
"Magnetically Filtered Low-Loss Scanning Electron Microscopy", Oliver C. Wells, Ultramicroscopy 47 (1992) 101–108, North-Holland.

Primary Examiner—Jack I. Berman
Assistant Examiner—James Beyer
Attorney, Agent, or Firm—Brown, Martin, Haller & McClain

[57] ABSTRACT

In the magnetic optical system of a transmission electron microscope (TEM), the increased strength of a second objective lens is used to increase the longitudinal energy dispersion by forming an image at a magnified second back-focal plane. The electric current distribution of other lenses in the microscope is reconfigured to compensate for any offsets introduced by the modified second objective lens. A plurality of deflectors are installed which enable the manipulation of the electron beam electronically between the specimen and the second back-focal plane. The magnified second back-focal plane is projected onto the selected-area aperture, allowing the use of the existing selected-area aperture as an objective aperture to achieve an energy filtering effect which improves the image contrast and resolution.

3 Claims, 2 Drawing Sheets

ENHANCED IMAGING MODE FOR TRANSMISSION ELECTRON MICROSCOPY

This invention was made with Government support under Grant No. P41-04050, awarded by the National Institute of Health. The Government has certain rights in this invention.

BACKGROUND OF THE INVENTION

In transmission electron microscopy, electrons are accelerated to an energy that is sufficient to ensure that at least a portion of the electrons are transmitted through a thin specimen instead of being absorbed. When electrons enter a material, they interact with the Coulomb forces of the constituent atoms, causing the electrons to scatter. This scattering can be elastic or inelastic, with the latter process resulting in energy loss and generating diffuse background noise in the image produced by the microscope. The thicker the specimen, the greater the inelastic scattering, resulting in image blur due to chromatic aberration, Thus, the capacity to view thicker specimens is limited.

A certain level of energy filtering for viewing thicker specimens can be achieved by use of an objective aperture, which is typically included in a TEM. This aperture intercepts the electrons scattered outside of the effective aperture in order to improve the contrast of the image. The smaller the aperture, the better the filtering provided. However, limitations are introduced by smaller apertures due to their sensitivity to contamination. Also, smaller apertures are difficult to manufacture since they must be perfectly circular to avoid distortion of the image.

Several more sophisticated methods have been devised for removal of inelastically scattered electrons, to improve imaging capabilities for thin specimens as well as allowing the examination of thicker specimens. These methods include: the Prism-Mirror system, the Omega filtering system, the Wien filter, and the Post-column imaging filter system.

The Prism-mirror system, developed by Castaing and Henry (1962) consists of a uniform-field magnetic prism and an electrostatic mirror. Electrons are deflected through 90 degrees by the prism, then through 180 degrees by the mirror, so that they pass into the magnetic field twice. Because their velocity is reversed, the electrons are deflected downwards and emerge from the device traveling in their original direction along the vertical axis of the microscope. The additional optics utilized in the process require modifications to the microscope column so that the Prism-mirror system is practical for use only with electron microscopes that are designed with the system installed or as an option.

The Omega filter uses a magnetic prism to deflect the electrons through an angle of typically 90-120 degrees after they have passed through the specimen, the objective lens and one low-excitation lens. A second prism with a magnetic field in the opposite direction deflects the electron beam downward and two further prisms redirect the beam along its original axis. Like the prism-mirror system, the Omega filter is practical for use only in columns that are specially designed to accommodate the system.

The Wien filter uses both magnetic and electrostatic fields, each of which are perpendicular to the entrance beam. This arrangement sets up retarding and accelerating fields at the entrance and exit of the filter which act as electrostatic lenses. An electron moving parallel to the optic axis continues in a straight line with a net force of zero. Like the previous filters, the Wien filter system represents a fundamental modification to a microscope column, making such a system practical only when the microscope has specifically been designed to accommodate it.

A fourth energy filtering system is the Post-column imaging filtering system. This system does not require the specialized configurations that the previous systems require and can be installed on most microscopes. However, the Post-column imaging filter is quite expensive and is complex to operate.

In addition to enhancement of image contrast, a desirable feature in transmission electron microscopes makes possible the recording of stereoscopic views of objects. Stereoscopic imaging is typically accomplished by tilting the specimen at two different angles to the axis. Tomographic reconstruction can similarly be achieved by taking images while tilting the specimen at many different angles. When viewed through a stereo-opticon, the two images produce the visual effect of a three-dimensional object. This tilting should be performed rapidly to permit on-line stereo viewing. Further, the tilting needs to be precise to allow off-line tomographic reconstruction. However, delays are encountered in current devices due to the fact that the images are translated, requiring additional alignment steps. These delays dictate that the stereo pairs must be viewed off-line, and for tomographic imaging, the 60 to 120 tomographic projections must be aligned with fiduciary markers or digital correlation methods before the three-dimensional volume can be generated.

BRIEF SUMMARY OF THE INVENTION

It is an advantage of the present invention to provide a device for removing inelastically scattered electrons to improve image contrast in a transmission electron microscope.

It is a further advantage of the present invention to provide a device for enhancing image contrast which can be installed on most transmission electron microscopes and is relatively simple to operate.

Still another advantage of the present invention is to provide a device which eliminates the requirement for image translation which results in delays in stereo viewing and alignment problems in tomographic reconstruction.

In an exemplary embodiment, in the magnetic optical system of a transmission electron microscope (TEM), the increased strength of a second objective lens is used to increase the longitudinal energy dispersion by forming an image at a magnified second back-focal plane. The electric current distribution of other lenses in the microscope is reconfigured to compensate for any offsets introduced by the modified second objective lens. A plurality of deflectors are installed which enable the manipulation of the electron beam electronically between the specimen and the second back-focal plane. The magnified second back-focal plane is projected onto the selected-area aperture, allowing the use of the existing selected-area aperture as an objective aperture to achieve an energy filtering effect which improves the image contrast and resolution.

The effective change in position of the objective aperture to the back-focal plane provides an increase in the separation between the specimen and the objective aperture. In traditional TEM configurations, this separation is so small that it does not permit the installation of additional electromagnetic coils to manipulate the beam before it enters the aperture. The increased separation provided by the present invention provides sufficient space for multiple coils to be installed, facilitating stereo-pair acquisition and other image manipulation.

Stereoscopic images may be generated without requiring movement of the sample by tilting the beam with strengthened tilting coils. By tilting the beam above and through the specimen and correcting for these changes in the original beam path below the specimen, a bright field image with a projection angle corresponding to beam tilt can be recorded. After the tilted beam has passed through the specimen, the induced image shift must be corrected. Re-alignment is accomplished by using a plurality of image shift coils below the objective lens and aperture, the installation of which is made possible by the increase in the separation between the specimen and objective aperture. The projection angles that can be attained by tilting the beam are sufficient for stereo pair acquisition, however, some mechanical tilting of the specimen is still required to effect tomographic reconstruction. Mechanical tilting is used to generate an image after acquisition of a corresponding beam tilt image. Because the beam tilt image is less likely to suffer from translational errors, it can be used to align the image obtained by mechanical tilt of the specimen.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which.

DETAILED DESCRIPTION OF A PREFERRED EMBODIMENT

Figure 1:
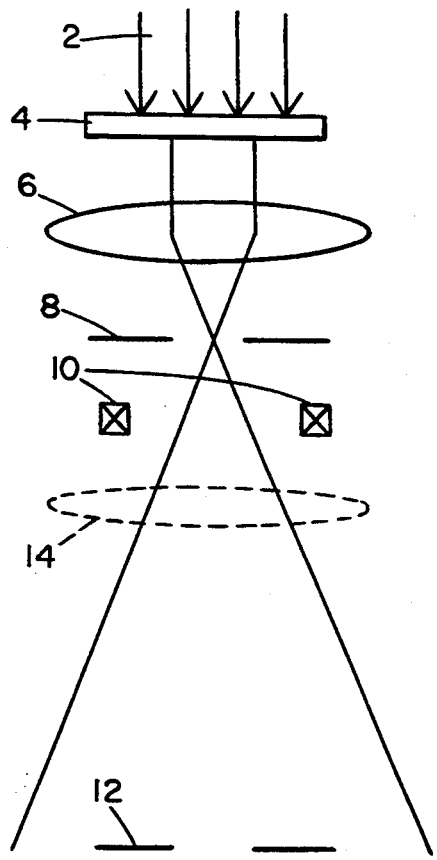
FIG. 1 is an electron ray diagram for a transmission electron microscope according to the prior art.

FIG. 1 schematically illustrates the elements of a transmission electron microscope (TEM) according to the prior art. (While the focusing elements are illustrated using symbols for optical lenses for simplicity, it is well known in the art that electrostatic and magnetic coils are used for manipulating the electron beam.) The electron beam 2, generated by a negatively biased tungsten filament and passed through an anode and condenser lens(es) (not shown), is transmitted through specimen 4 (some electrons will be scattered). The transmitted electron beam enters the field of the objective lens 6, which produces a magnified image of the specimen. The objective aperture 8 is used to intercept scattered electrons. The objective aperture 8 is generally on the order of 10 microns or larger. Image shift coils 10 are provided for adjustment of location of the final image, but are not shown as creating any effect on the electron beam 2 in the conventional mode. Selected-area aperture 12 selects a region of an image so that diffraction patterns from the selected area only can be obtained. The second objective lens 14 is illustrated with dashed lines to indicate that it is present in the lens system of a conventional TEM but is not strongly excited and, therefore, does not contribute significantly to modification of the electron beam path.

Figure 2:
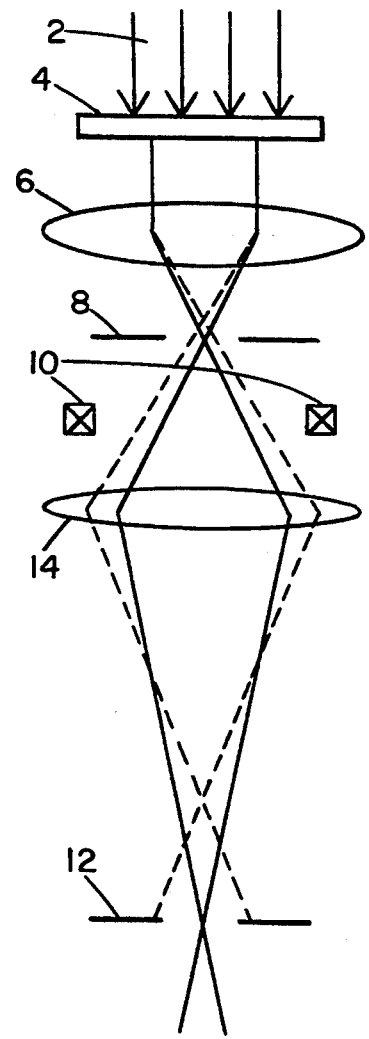
FIG. 2 is an electron ray diagram for a transmission electron microscope according to the present invention.

The imaging mode provided by the present invention is illustrated in FIG. 2. The same elements are present as in the conventional TEM, however, the second objective lens 14 is strongly excited so that a new magnified back-focal plane (a second back-focal plane) of the objective lens 6 is imaged onto the plane of the selected-area aperture 12, making the selected-area aperture an objective aperture. The longitudinal magnification of the second objective lens 14 which is approximately the square of the lateral magnification provides an increased energy dispersion at the second back-focal plane. The increased strength of second objective lens 14 is provided by constructing coils with additional ampere-turns as compared to conventional coil configurations. Other methods of providing increased magnetic field strength are known in the art and may be used to effect the modification of second objective lens 14 (On a customized JEM-4000EX microscope, the second objective lens, which is referred to as "the objective mini-lens", was modified to have a magnification of 3.2x.) By imaging a magnified second back-focal plane of the objective lens 6 onto the plane of the selected-area aperture 12, a larger aperture can be used to obtain the same or better contrast than would be obtained at the first back-focal plane in a conventional system, i.e., the objective aperture 8. This is advantageous since apertures smaller than 10 micron in diameter are difficult to make and are not readily available. Further, when very small apertures are used they tend to contaminate more easily, with the deposits often becoming charged, contributing to the degradation of resolution.

The increased strength of the second objective lens 14 may result in offsets in the otherwise fixed magnification levels available in an unmodified TEM. These offsets can be compensated by modifying the electric current distribution of the magnification lenses (not shown) which are located downstream from the selected-area aperture. Adjustment of the electric current distribution will vary depending on the individual TEM configuration and imaging requirements. Such adjustments are known in the art.

Figure 3:
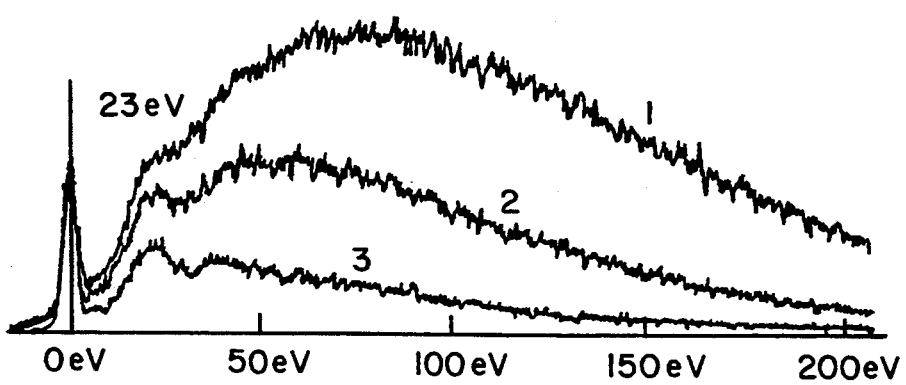
FIG. 3 is a plot of energy loss spectra with and without energy filtering according to the present invention.

The energy filtering effect of the present invention is illustrated in the plot of FIG. 3. The energy loss spectrum in curve 1 is from a 2 $\mu$m thick section of a biological specimen. The inelastic scattering is increased due to the thickness of the specimen, and the resultant image will be blurred due to chromatic aberration in the magnetic lenses. This blur will degrade image resolution and contrast. Curve 2 shows the energy loss spectrum filtered by the use of a 10 $\mu$m objective aperture. While improvement is seen over the unfiltered beam, comparison with the energy loss in curve 3 illustrates the advantage of incorporating the selected-area aperture 12 as an objective aperture according to the present invention. Image contrast is enhanced by both the energy filtering effect and the effectively smaller aperture size. Contrast improvement of up to 100% compared to that obtained with a same sized objective aperture can be seen on specimen sections of up to 2 $\mu$m.

Optical sectioning of thick (>1 $\mu$m) sections would be facilitated by reducing the depth of field. The use of a hollow-cone illumination device (HCID) reduces the depth of field with a large semi-cone angle (>4°). However, in order for the bright beam to pass through, the objective aperture must be removed. Since the function of the objective aperture is assumed by the selected-area aperture in the present invention, the loss of the objective aperture does not result in increased background noise from scattered electrons. The image shift coils 10 are used in conjunction with the deflector coils (see FIG. 4) to de-scan the beam, bringing the bright beam back to the optical axis.

Figure 4:
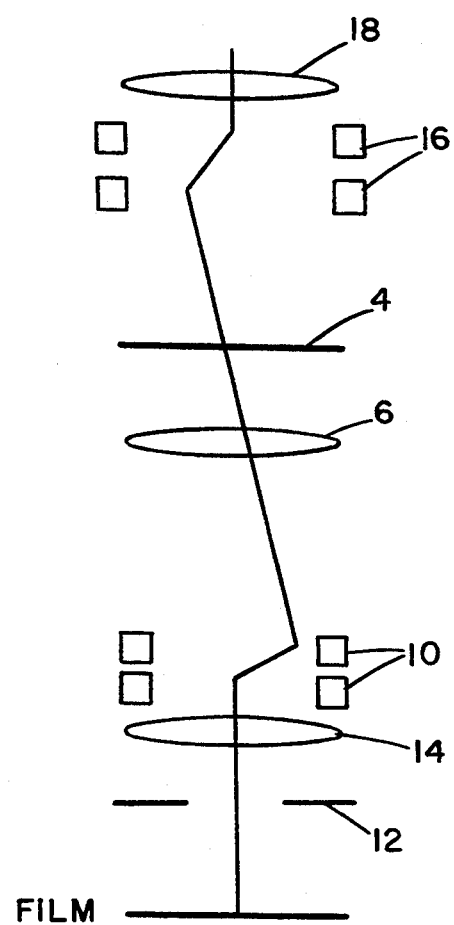
FIG. 4 is an electron ray diagram showing beam tilt.

The separation between the specimen 4 and objective aperture 8 in a conventional TEM is only 2–4 mm, which is not enough space to install electromagnetic coils to manipulate the electron beam before it reaches the objective aperture 8. The shifting of the objective aperture to the selected-area aperture 12 according to the present invention provides a separation of approximately 100 mm between the specimen and the "new" objective aperture (selected-area aperture) 12, permitting the insertion of image shift coils 10. As illustrated in FIG. 4, the deflector ("tilting") coils 16 are located downstream from condenser 18. The deflector coils tilt the beam 2 above and through the specimen 4, bringing it back below the specimen. The beam is realigned parallel to the optical axis by image shift coils 10 below the objective aperture 8. To avoid mechanically moving the objective aperture 8 to chase the beam to different tilts, the objective aperture 8 must be removed. However, as explained above for the HCID, the selected-area aperture 12 acts as an objective aperture, assuming the function of the conventional objective aperture 8. A JEM 4000EX 400 kV TEM was modified to achieve tilted bright field imaging with maximum angles of ±5°. Beyond the modifications to the second objective lens, higher strength beam deflectors were employed to shift the image back on axis.

Elimination of the requirement of mechanically tilting the specimen makes it possible to immediately acquire and display stereo pairs. Tomographic reconstruction can be similarly accomplished with the limitation that the large angles required do not permit complete reliance on beam tilting, so that some mechanical tilting is still necessary. Acquisition of each mechanical tilt image is preceded by acquisition of a corresponding beam tilt image. Because the beam tilt image is much less likely to suffer from translational errors, it can be used to re-align the mechanical tilt image.

Optimal use of tilted bright field imaging for stereo pair and tomographic series acquisition requires a stored set of microscope parameters for automated tilting. The tilt angle can be pre-calibrated with a thick silicon sample in a rotational holder.

One of the effects of tilting the beam may be increased aberrations. The objective lens and stigmator coils can be adjusted to compensate for these aberrations. In addition, these problems are less apparent with bright field images of thick biologic specimens at low to intermediate magnifications. The combination of intermediate, rather than high resolution demands and compensation with lens adjustments yields high quality images for three-dimensional microscope visualization in biologic specimens.

By creating a magnified back-focal plane, the present invention permits the use of standard size apertures while still providing effective cut-off limits for inelastically scattered electrons. This improved apparatus and method for energy filtering makes use of components that are already available in conventional TEMs by adjusting the current distributions. Most importantly, the second objective lens is significantly strengthened to create the magnified second back-focal plane.

It will be evident that there are additional embodiments and applications which are not disclosed in the detailed description but which clearly fall within the scope and spirit of the present invention. The specification is, therefore, not intended to be limiting, and the scope of the invention is to be limited only by the following claims.

We claim:

1. A method for imaging a thick biological specimen and for filtering inelastically scattered electrons in a conventional transmission electron microscope having a first objective lens disposed in an optical axis downstream from said specimen, said first objective lens having a first back-focal plane, and an objective aperture disposed downstream from the first objective lens, the method comprising:
   removing the objective aperture;
   disposing a plurality of tilting coils upstream of said specimen for moving an electron beam with respect to said optical axis;
   disposing a plurality of image shift coils downstream from said first objective lens for re-aligning said electron beam with said optical axis;
   increasing a strength of a second objective lens disposed downstream from said first objective lens wherein said second objective lens creates a magnified second back-focal plane different from said first back-focal plane; and
   disposing an aperture along said optical axis at said magnified second back-focal plane.

2. A method for enhancing image contrast and resolution in a conventional transmission electron microscope wherein an electron beam is transmitted through a thick specimen to be imaged along an optical axis, the method comprising:
   removing a conventional objective aperture;
   tilting said electron beam at an angle with respect to said optical axis by disposing a plurality of tilting coils along said optical axis upstream of said specimen;
   focusing said electron beam at a first back-focal plane by disposing a first objective lens along said optical axis downstream from said specimen;
   re-aligning said electron beam with said optical axis by disposing a plurality of image shift coils downstream from said first objective lens;
   increasing a strength of a second objective lens disposed downstream from said image shift coils to create a magnified second back-focal plane at a position along said optical axis different than said first back-focal plane; and
   disposing an aperture at said magnified second back-focal plane.

3. In a conventional transmission electron microscope for generating an image of a thick specimen by transmitting an electron beam along an optical axis through said specimen, said transmission electron microscope having a first objective lens with a first back-focal plane and having no conventional objective aperture, the improvement comprising:
   a plurality of tilting coils disposed along said optical axis prior to said specimen for tilting said electron beam with respect to said optical axis as it is transmitted through said specimen;
   a plurality of image shift coils for re-aligning said electron beam with said optical axis;
   a second objective lens downstream from said image shift coils, said second objective lens having a strength whereby a magnified second back-focal plane is created; and
   an aperture disposed along said optical axis at said magnified second back-focal plane.

* * * * *